United States Patent
Desalvo et al.

(10) Patent No.: US 12,325,927 B2
(45) Date of Patent: Jun. 10, 2025

(54) COMPLEX WAVEFORM FOR ELECTROLYTIC PLATING

(71) Applicant: MacDermid Enthone Inc., Waterbury, CT (US)

(72) Inventors: Donald Desalvo, Jiangsu Province (CN); Ron Blake, Oxford, CT (US); Carmichael Gugliotti, Bristol, CT (US); William J. Decesare, Wolcott, CT (US); Richard A. Bellemare, Watertown, CT (US); James Watkowski, Middlebury, CT (US); Ernest Long, Burlington, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 0 days.

(21) Appl. No.: 18/568,465

(22) PCT Filed: May 25, 2022

(86) PCT No.: PCT/US2022/030882
§ 371 (c)(1),
(2) Date: Dec. 8, 2023

(87) PCT Pub. No.: WO2022/271390
PCT Pub. Date: Dec. 29, 2022

(65) Prior Publication Data
US 2024/0271307 A1    Aug. 15, 2024

Related U.S. Application Data

(60) Provisional application No. 63/215,031, filed on Jun. 25, 2021.

(51) Int. Cl.
*C25D 5/18* (2006.01)
*C25D 3/38* (2006.01)
(Continued)

(52) U.S. Cl.
CPC .............. *C25D 5/18* (2013.01); *C25D 3/38* (2013.01); *C25D 5/02* (2013.01); *C25D 7/00* (2013.01);
(Continued)

(58) Field of Classification Search
CPC .................................... C25D 3/38; C25D 5/18
See application file for complete search history.

(56) References Cited

U.S. PATENT DOCUMENTS 6,827,833 B2 * 12/2004 Taylor ................ C25D 5/18
205/125
8,784,634 B2 * 7/2014 Reents ................ C25D 5/18
205/291

(Continued)

OTHER PUBLICATIONS

Shen et al. "Periodic Pulse Reverse Cu Plating for Through-Hole Filling" ECS Electrochemistry Letters, vol. 2, No. 5, 2013, pp. D23-D25 Experimental section.

*Primary Examiner* — Brian W Cohen
(74) *Attorney, Agent, or Firm* — Carmody Torrance Sandak & Hennessey LLP

(57) ABSTRACT

A method of copper electroplating in the manufacture of printed circuit boards. The method is used for filling through-holes and blind micro-vias with copper. The method includes the steps of: (1) preparing an electronic substrate to. receive copper electroplating thereon; (2) forming at least one of one or more through-holes and/or one or more blind micro-vias in the electronic substrate: and (3) electroplating copper in the at one or more through-holes and/or one or more blind micro-vias by contacting the electronic substrate with an acid copper electrolyte. The acid copper electrolyte is used to plate the one or more through-holes and/or the one or more blind micro-vias using a complex waveform including pulse reverse plating, DC plating and/or synchronous pulse plating. The complex waveforms can be used for (Continued)

filling through-holes and blind microvias with copper without defects.

24 Claims, 3 Drawing Sheets

(51) Int. Cl.
  *C25D 5/02* (2006.01)
  *C25D 7/00* (2006.01)
  *C25D 7/12* (2006.01)
  *H05K 3/42* (2006.01)
(52) U.S. Cl.
  CPC ............. H05K 3/421 (2013.01); H05K 3/424 (2013.01); *C25D 7/12* (2013.01)

(56) References Cited

U.S. PATENT DOCUMENTS

| | | | |
|---|---|---|---|
| 2003/0221967 A1* | 12/2003 | Tsuchida | C25D 5/611 |
| | | | 205/125 |
| 2012/0160696 A1* | 6/2012 | Araki | H01L 21/2885 |
| | | | 205/171 |
| 2013/0071755 A1 | 3/2013 | Orguro | |
| 2014/0042032 A1* | 2/2014 | Shimoyama | C25D 5/02 |
| | | | 204/230.2 |
| 2018/0010258 A1 | 1/2018 | Fujiwara et al. | |
| 2021/0130970 A1 | 5/2021 | DeSalvo et al. | |

* cited by examiner

COMPLEX WAVEFORM FOR ELECTROLYTIC PLATING

FIELD OF THE INVENTION

The present invention relates generally to an electrolytic deposition method for metallizing electronic substrates.

BACKGROUND OF THE INVENTION

Electrolytic metal plating solutions are used in many industrial applications, including anticorrosion and decorative coatings, and in the electronics industry for metallizing substrates used in electronic devices, including substrates that include one or more blind vias, through-holes, and trenches. Electronic devices such as computers, cellular telephones, electronic entertainment devices, etc. are manufactured by mounting components on circuit boards having electrically conductive traces thereon to interconnect the components.

Printed circuit boards, printed wiring boards and other similar substrates may be metallized with electrolytic metals such as copper. Copper has a better electrical conductivity than many other metals and allows for smaller features application. Aqueous sulfuric acid copper baths are used for the fabrication of printed circuit boards (PCB) and semiconductors.

In the manufacture of such electronic devices, development of technology and economics have driven the industry toward ever-smaller devices containing ever-increasing number of components. Interconnect features can be formed by techniques involving masking, etching, and plating of conductive metal (typically copper), to provide interconnects.

Interconnect features include features such as blind micro-vias (BMV), trenches and through-holes that are formed in a dielectric substrate. These features are metallized, preferably with copper, to render the interconnect electrically conductive. During circuit fabrication, copper is electroplated over select portions of the surface of the printed circuit board, into blind vias and trenches and onto the wall of through-holes passing between the surfaces of the circuit board base material. The walls of the through-holes are metallized to provide conductivity between the circuit layers of the printed circuit boards.

In circuit board modules and electronic devices, electronic components mounted on the circuit board include surface mounting-type electronic components and insertion mounting-type electronic components. Surface mounting-type electronic component are typically mounted on a board by soldering a terminal to a copper foil provided on a front surface of the circuit board. Insertion mounting-type electronic components are typically mounted on the board by inserting a lead terminal into a penetrating hole provided in the circuit board and soldering the lead terminal.

Electronic components mounted on the circuit board emit heat when current flows through them. In addition, large amounts of heat can be generated in electronic components in which large current flows. When the temperature of the electronic component or the circuit board rises excessively due to heat emitted by the electronic component, there is a concern that an electronic component or an electric circuit formed on the circuit board can malfunction.

Resin or paste plugging of through-holes has been part of the build-up technology in high density interconnect constructions and IC substrates for many years. However, increasing circuit density and stacked via constructions coupled with higher power devices have added an extra dimension of thermal management. It has been found that solid copper filling of through-holes offers many advantages over resin or paste plugging including, for example, reducing the CTE mismatch, providing a stable platform for stacking blind microvias, and offering thermal management properties for high power devices.

The miniaturization of electronic devices involves a combination of thinner core materials, reduced line widths and smaller diameter through-holes. Filling the through-holes by copper plating is more difficult with higher aspect ratios, often resulting in larger voids and deeper dimples. Another problem with through-hole filling is the manner of filling. Unlike blind vias which are closed at one end and fill from bottom to top, through-holes pass through a substrate and are open at two ends. When through-holes are being filled with copper, plating parameters and bath additives are chosen so that the copper begins to preferentially deposit on the walls at the center of the through-hole where it bridges at the center to form two blind vias as shown in FIG. 1. This also allows for a plating deposition that is at least substantially free of defects such as voids.

Plating bath additives enable the right type of fill. If the right combination of additives is not chosen, the copper plating can result in undesired conformal copper deposition on the sides of the through-holes rather than filling of the through-holes.

One problem with through-hole plating is that the copper fails to completely fill the through-hole and both ends remain unfilled. An incomplete through-hole fill in which the middle of the hole does not fully close can result in large cavities in the center of the hole as the tops and bottoms of the hole close off due to the deposit preferentially thickening from what is referred to as "dog-boning". The result is a pinching off of the top and bottom and cavities in the center. Another issue is the incomplete filling of the holes after a bridge is formed across the center of the hole leaving deep depressions or open spaces at the tops and bottoms of the hole. The open spaces at the top and bottom of the holes are referred to as "dimples". Thus, it is desirable that the through-hole filling process be optimized to completely fill the hole and eliminate the presence of dimples. An ideal process completely fills through-holes with a high degree of planarity, i.e., build up consistency, without voids, to provide optimum reliability and electrical properties and at as low as possible a surface thickness for optimum line width and impedance control in an electrical device.

Known electroplating techniques employ direct current (DC) and pulse plating techniques, including periodic pulses, periodic reverse pulses, and duplex pulses, by way of example and not limitation in various ways to fill through-holes and blind vias and various waveforms, electrolyte chemistry, process conditions etc. have been suggested to provide a desired result.

For example, U.S. Pat. Nos. 10,501,860 and 11,015,257 to Fujiwara et al., the subject matter of each of which is herein incorporated by reference in its entirety, describe a pulse reverse plating regime for electroplating a metal such as copper onto a substrate that utilizes superposing cathodic pulses in the pulse sequence. In addition, it is describe that the use of pulse breaks or rest periods is not advantageous in methods of bridging and filling through-holes and further that setting first and second superposing cathodic pulses at least nearly simultaneously with reverse pulses at respective opposing sides of the substrate and preferably for the same duration as the reverse pulses provides a superior result over setting pulse breaks simultaneously with respective reverse pulses.

U.S. Pat. Pub. No. 2021/0130970 to Desalvo et al., the subject matter of which is herein incorporated by reference describes a method of filling through-holes and blind vias with copper in the fabrication of printed circuit board, printed wiring boards, and other electronic substrates.

It is desirable to provide a method of electroplating that provides good plating distribution, without defects, especially within through-holes and blind via holes.

SUMMARY OF THE INVENTION

It is an object of the present invention to provide a reliable method of metallizing through-holes and blind vias (including microvias) with high aspect ratios and without any voids or defects.

It is another object of the present invention to provide a reliable method of metallizing through-holes and blind vias in a plating process arranged in a vertical configuration.

It is another object of the present invention to provide a reliable method of metallizing through-holes and vias in a plating process arranged in a horizontal configuration.

It is still another object of the present invention to provide a plating cycle for metallizing through-holes and blind vias, including a plating cycle that includes both direct current and pulse plating.

It is still another object of the present invention to provide a pulse plating regime that uses a complex waveform to initiate plating in the center of a through-hole.

The use of a complex multi-step waveform can produce good results and various waveforms have been developed that utilize forward (cathodic) pulses of certain duration and intensity interspersed with reverse (anodic) pulses of certain duration and intensity.

The complex waveform comprises a repeatable sequence, the repeatable sequence comprising a set of pulse plating periods including at least one forward pulse and at least one reverse pulse in any order and also optionally including at least one longer duration rest period. The set of pulse plating periods may include pulse breaks between at least one of the forward pulses and at least one of the reverse pulses in the set of pulse plating periods in the repeatable sequence. Alternatively, the set of pulse plating periods may include pulses breaks between some of the forward pulses and reverse pulses in the set of pulse plating periods in the repeatable sequence. In one embodiment, the set of pulse plating periods in the repeatable sequence includes pulse breaks between each pulse in the set of pulse plating periods, including each forward pulse and each reverse pulse in the set of pulse plating periods.

DETAILED DESCRIPTION OF THE PREFERRED EMBODIMENTS

Figure 1:
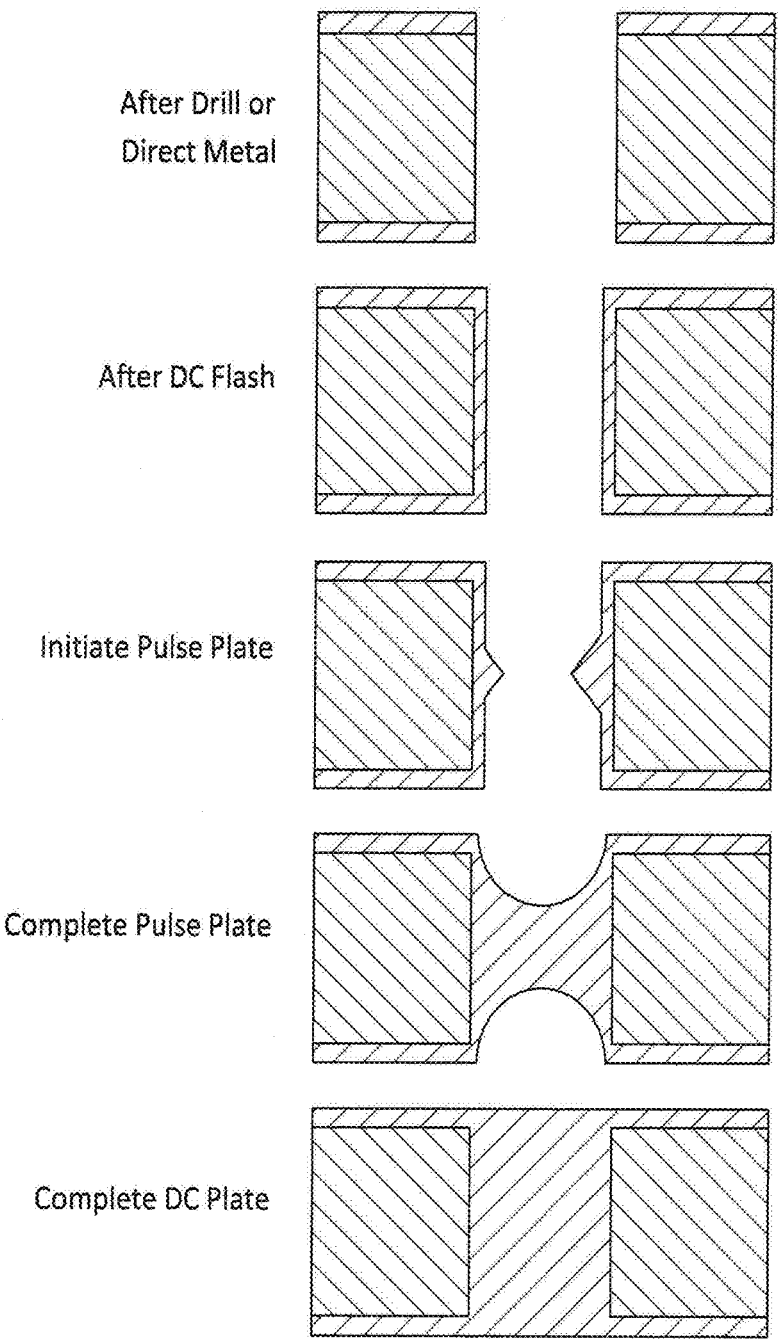
FIG. 1 depicts the steps of an example of a through-hole plating process for copper.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform herein. Furthermore, it is also to be understood that the value to which the modifier "about" refers is itself specifically disclosed herein.

As used herein, spatially relative terms, such as "beneath", "below", "lower", "above", "upper" and the like, are used for ease of description to describe one element or feature's relationship to another element(s) or feature(s) as illustrated in the figures. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein the term "substantially-free" or "essentially-free" if not otherwise defined herein for a particular element or compound means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytically methods.

The terms "printed circuit board" and "printed wiring board" are used interchangeably throughout this specification.

The terms "plating" and "electroplating" are used interchangeably throughout this specification.

As used herein, the term "immediately" means that there are no intervening steps.

As used herein, the term "dimple" refers to a depression in the bridge or conformal copper plating layer over the filled through-holes and/or blind micro-vias.

As used herein, the term "waveform" refers to a repeatable sequence, the repeatable sequence comprising a set of pulse plating periods including at least one forward pulse and at least one reverse pulse in any order and also optionally including at least one rest period.

As used herein, the term "pulse break" refers to a short period of dead time between pulses in a set of pulse plating periods.

As used herein, the term "rest period" refers to a longer duration period of dead time as compared with a pulse break in a set of pulse plating periods.

As used herein, the term "asynchronous waveform" refers to a waveform that during plating, when periodic pulse reverse rectification is supplied separately to a first side and a second side of a substrate, the waveforms supplied to each side are either phase shifted or completely different from each other.

As used herein, the term "synchronous waveform" refers to a waveform that during plating, when periodic pulse reverse rectification is supplied separately to a first side and a second side of a substrate, the waveforms supplied to each side are identical and in phase and are synchronous.

As used herein, the term "aspect ratio" refers to the ratio of the height or depth of the opening to the diameter of an opening (including through-holes, blind microvias, trenches, etc.) in a substrate.

One of the benefits of the present invention is that plating, especially copper plating, is already a part of the PCB manufacturing process, so being able to use copper plating to fill a through-hole eliminates the need for other processes such as plugging and sanding, copper coining, etc.

Furthermore, the use of pure copper provides a much higher thermal conductivity than conductive plugs and adhesives. Thus, there is an added benefit of thermal conductivity if it is needed. The copper electroplating process described herein produces a copper deposit that exhibits high thermal conductivity and good electrical conductivity.

The copper electroplating process, including the use of carefully formulated electrolytes and plating conditions, allows for the complete filling of through-holes.

The general steps of the process to metallize features in an electronic substrate include the following:

The initial step is to provide the PCB with various drilled through-hole arrays. Thus, the printed circuit board comprises a metallized panel with an array or arrangement of drilled through-holes. Through-holes, blind micro vias, and such can be formed by various methods, including, for example, mechanical drilling, laser drilling, plasma etching, or single or double shot.

The PCB may include regions of dense features, such as memory arrays or gate arrays. The dense features may span an entire integrated circuit or may be limited to discreet portions of the integrated circuit. These regions of dense features may cause concentration gradients in plating additives, such as suppressors, which can lead to uneven fill characteristics between such edge features and central features in the dense feature regions.

Next, the through-holes are made conductive using a metallization technique as is generally known in the art. Various metallization techniques may be used including, for example, sputter coating, electroless copper, carbon-based direct metallization, graphite-based direct metallization, conductive polymers, palladium-based direct metallization, among others. Other metallization techniques would be known to those skilled in the art and would be usable in the process described herein. The primary metallization layer may be electroless copper, electrolytic copper flashing, or a direct metallization layer formed by carbon, graphite, or conductive polymer-based direct metallization.

In one embodiment, a conductive seed layer is formed on the non-conductive surface to initiate the electroplating of copper. The seed layer is electrically conductive, provides adhesion and permits the exposed portions of its upper surface to be electroplated. Examples of the conductive seed layer include, but are not limited to, metal layers such as copper or palladium that may be formed by electroless deposition, graphite, carbon, and conductive polymers.

The panel to be plated is preferably copper or a copper-coated substrate.

Next, the metallized panels are cleaned and activated using conventional pretreatment techniques such as acid or alkaline cleaning and acid dip or microetching with rinsing in between steps.

Thereafter, the panels are contacted with an electroplating solution comprising a source of metal ions of the metal to be plated. This electroplating solution is optionally, but preferably, an acid copper electrolyte, which comprises a source of copper ions, an acid (for example, sulfuric acid or methane sulfonic acid), halide ions, and specialized organic additives comprising suppressors, accelerators, and secondary suppressors. The acid copper electrolyte, in combination with a specialized rectification procedure, is capable of filling through-holes with copper in a highly effective process. The aqueous acidic copper electrolyte can be used in conventional vertical or horizontal plating equipment.

In one embodiment, the plating cycle comprises (a) pulse plating for a first time period, wherein the pulse plating uses pulse reverse plating with a multiple-step pulse waveform on opposite sides of the electronic substrate, followed by (b) direct current plating using forward current for a second time period as described in further detail below.

The source of copper ions in the acid copper electrolyte may be copper sulfate.

The resistivity of the copper plating solution is greater when the concentration of copper sulfate is increased. The solubility of copper sulfate decreases when the sulfuric acid concentration is increased. The concentration of copper sulfate in the acid copper electrolyte is typically maintained within the range of about 100 to about 300 g/L, more preferably about 180 to about 280 g/L, most preferably in the range of about 200 to about 250 g/L.

The principal function of the acid is to provide for maximum solution conductivity. Due to the high conductivity of the solution, the anode and cathode polarizations are small as is the voltage required for depositing copper. In addition, when very high cathode current densities are used, a higher concentration of copper sulfate is required within the recommended limits. Changes in sulfuric acid concentration have more influence than changes in copper sulfate concentration on anode and cathode polarization and on solution conductivity. The concentration of sulfuric acid in the acid copper electrolyte is typically maintained within the range of about 10 to about 150 g/L, more preferably about 60 to about 100 g/L.

The acid copper electrolyte also contains halide ions, most preferably chloride ions. Chloride ions enhance the adsorption and inhibition of the wetter. A small amount of chloride ions acts as binding sites for the polyglycols to the electrode surface. Chloride may be added in the form of sodium chloride or as diluted hydrochloric acid. Chloride ions in the acid copper electrolyte act to eliminate striated deposits in high current density areas. Chloride ions also affect the surface appearance, structure, micro-hardness, crystallographic orientation and internal stress of the deposits. Chloride ions are consumed by electrochemical/chemical changes during electrolysis, partial inclusion into the deposit, dragout loss, bath dilution, and anode maintenance. The concentration of chloride ions in the acid copper electrolyte is typically maintained within the range of about 20 to about 200 ppm, more preferably about 60 to about 150 ppm, most preferably within the range of about 70 to about 100 ppm.

The characteristics of copper deposits are influenced by factors such as concentration of copper sulfate, free acid, additives, temperature, cathode current density and the nature and degree of agitation.

In one embodiment, the acid copper electrolyte works well in the absence of any iron ions, including ferric ions and ferrous ions. Thus, the acid copper electrolyte is preferably at least essentially free of both ferric ions and ferrous ions, and more preferably is free of both ferric ions and ferrous ions.

Fill-in behavior in the through-hole is influenced at least in part by controlling the deposition kinetics within the through-holes and on the horizontal portions and edges. This may be achieved by introducing certain organic additives into the acid copper electrolyte to influence the rate of copper ions that deposit on the respective locations. As discussed above, the organic additives include a combination of one or more accelerators, one or more suppressors, and/or one or more secondary suppressors.

Suitable accelerators incorporate organic compounds that contain sulfur and other functional groups and is responsible for the formation of a small grain refined deposit. The accelerator also acts as a leveling agent. The accelerator is consumed by incorporation into the electrolytic deposit at the cathode or by oxidation at the surface of the anode, especially if insoluble anodes are used. The accelerator can also be consumed by de-coupling in the presence of metallic copper, generating by-products, or by air oxidation, anode maintenance or by dragout loss/bath dilution.

Examples of suitable accelerators include one or more of 3-(benzothiazolyl-2-thio)-propyl sulfonic acid, sodium salt: 3-mercaptopropane-1-sulfonic acid, sodium salt; ethylene dithiodipropyl sulfonic acid, sodium salt; bis-(p-sulfophenyl)-disulfide, disodium salt; bis-($\omega$)-sulfobutyl)-disulfide, disodium salt; bis-($\omega$-sulfohydroxypropyl)-disulfide, disodium salt; bis-($\omega$)-sulfopropyl)-disulfide, disodium salt; bis-($\omega$-sulfopropyl)-sulfide, disodium salt; methyl-($\omega$)-sulfopropyl)-disulfide, disodium salt; methyl-($\omega$)-sulfopropyl)-trisulfide, disodium salt; O-ethyldithio-carbonic acid-S-($\omega$-sulfopropyl)-ester, potassium salt; thioglycolic acid; thiophosphoric acid-O-ethyl-bis-($\omega$-sulfopropyl)-ester, disodium salt; and thiophosphoric acid-($\omega$-sulfopropyl)-ester, trisodium salt. Other suitable sulfur-containing compounds and salts thereof would also be known to those skilled in the art and would be usable in the acid copper electrolyte described herein. In a preferred embodiment, the accelerator comprises bis-($\omega$) sulfopropyl)-sulfide or 3-mercaptopropane-1-sulfonic acid or a salt thereof.

The concentration of the one or more accelerators in the acid copper electrolyte is typically maintained in the range of about 0.1 to about 30 ppm, more preferably about 0.5 to about 20 ppm, most preferably within the range of about 4-10 ppm.

The suppressor comprises a high molecular weight organic compound, such as a polyglycol, having low solubility in the solution and a low coefficient of diffusion. The suppressor is adsorbed on the cathode surface, uniformly forming a diffusion layer that limits the transfer of accelerator and secondary suppressor. In the presence of chloride ions, the degree of adsorption and inhibition is further enhanced. In one embodiment, the molecular weight of the suppressor is at least about 300. More preferably, the molecular weight of the suppressor is between about 500 and about 5,000.

The suppressor may be consumed during electrolysis, in which reduction of molecular weight occurs, or may be consumed by partial inclusion into the deposit. As with the accelerator, the suppressor may be consumed by anode maintenance or by dragout loss/bath dilution.

Examples of suitable suppressors include one or more of carboxymethylcellulose, nonylphenolpolyglycolether, octandiol-bis-(polyalkylene glycol ether), octanol polyalkylene glycol ether, oleic acid polyglycol ester, polyethylene glycol polypropylene glycol copolymerisate, polyethylene glycol, polyethylene glycol dimethylether, polypropylene glycol, polyvinylalcohol, β-naphthyl polyglycol ether, stearic acid polyglycol ester, stearic acid alcohol polyglycolether, and copolymers of propylene glycol and ethylene glycol. Other suitable polyglycols and similar compounds would also be known to those skilled in the art and would be usable as the suppressor in the acid copper electrolyte. In one preferred embodiment, the wetter comprises copolymers of propylene glycol and ethylene glycol.

The concentration of the suppressor in the acid copper electrolyte is typically maintained in the range of about 0.1 to about 50 g/L, more preferably about 1 to about 10 g/L.

The secondary suppressor is typically a medium molecular weight organic compound containing key functional groups. In one embodiment, the secondary suppressor has a molecular weight of between about 300 and about 10,000, more preferably between about 500 and about 5,000. The secondary suppressor has low solubility in the solution and a low coefficient of diffusion and acts through selective adsorption on a readily accessible surface (i.e., flat surface and protruding high points). The secondary suppressor is consumed by electrochemical/chemical changes during the electrolysis, by partial inclusion in the deposit, by anode maintenance, and by dragout loss/bath dilution.

Examples of suitable secondary suppressors include various polyamines, ethoxylated polyamines, polyamides, polyimides polypyridine, polyimidazole, polyvinyl pyridine, polyvinyl imidazole, ethoxylated polyvinyl pyridine, and ethoxylated polyvinyl imidazole. In one preferred embodiment, the secondary suppressor comprises ethoxylated polyamines and/or polyvinyl pyridine.

The concentration of the secondary suppressor in the acid copper electrolyte is typically maintained in the range of about 0.001 to about 200 ppm, more preferably about 0.001 to about 100 ppm, most preferably about 0.001 to about 50 ppm.

Table 1 summarizes the ingredients of a typical copper electrolyte for use in the process described herein:

TABLE 1

Typical Ingredients and Concentrations of Copper Electrolyte

| Ingredient | Concentration Range |
| --- | --- |
| Copper sulfate | 100-300 g/L |
| Sulfuric acid | 10-150 g/L |
| Chloride ions | 40-200 ppm |
| Accelerator | 4-10 ppm |
| Suppressor | 1-10 g/L |
| Secondary suppressor | 0.001-50 ppm |

The substrate is contacted with the aqueous acid copper electrolyte by various means known in the art including, for example, immersion of the substrate into the bath or use of other plating equipment. By using specialized pulse rectification, pulse waveforms are initially used that result in accelerated filling of the middle of the through-holes to create a "bridge" while minimizing the amount of surface copper plated, which can be accomplished in both horizontal and vertical systems. The optimized cycle described herein ensures that formation of the bridge occurs quickly and efficiently. By minimizing the amount of time to form the bridge, the amount of surface copper plated can also be minimized. This is important in the IC substrate industry, because less copper that is deposited and finally etched to define the circuitry results in better line resolution capabilities. Since the trend is always to finer and finer circuitry, the ability to maximize trace resolution is an advantage of the process described herein. This is directly related to the amount of copper that needs to be finally etched at the end. In other words, better resolution means capabilities for finer lines and tighter spacing.

As the center of the through-hole closes, the waveform may be or is optionally transitioned to straight DC current in the same acid copper electrolyte. The result is a continuous plating of the through-hole until it is completely filled.

The use of a multi-step waveform as described herein can produce good results as compared with waveforms of the prior art. Various waveforms have been developed that utilize forward (cathodic) pulses of certain duration and intensity interspersed with reverse (anodic) pulses of certain duration and intensity.

In one embodiment, the waveform includes a repeatable sequence, wherein the repeatable sequence comprises a set of pulse plating periods, the set of pulse plating periods comprising, in any order, one or more forward pulses, one or more reverse pulses, and optionally a rest period, wherein the set of pulse plating periods includes pulse breaks between at least one of the forward pulses and at least one of the reverse pulses in the set of pulse plating periods. In another embodiment, the set of pulse plating periods includes pulse breaks between some of the forward pulses and some of the reverse pulses in the set of pulse plating periods. In another embodiment, the set of pulse plating periods includes pulse breaks between each pulse in the set of pulse plating periods, including each forward pulse and each reverse pulse in the set of pulse plating periods.

In one embodiment, the repeatable sequence comprising the set of pulse plating periods has a duration of about one second, more preferably the repeatable sequence has a duration of exactly one second. In another embodiment, the repeatable sequence has a duration of between about 0.5 and about 5 seconds, so long as the proportion of the duration of the pulses remains substantially the same. The duration of the repeatable sequence could be further defined and calculated as would be known to those skilled in the art.

In one embodiment, the rectifier(s) is/are programmable with multiple steps, including at least 4 steps or least 6 steps, or at least 8 steps, or at least 10 steps, or at least 12 steps, or at least 14 steps, or at least 16 steps or at least 18 steps or at least 20 steps, etc. In one preferred embodiment, the rectifier(s) is/are programmable with steps which define a single set of pulse plating periods as further explained herein. One example of a repeatable sequence comprising a single set of pulse plating periods includes the following steps:

1) a first forward pulse of a first forward duration and first forward intensity;
2) a first pulse break;
3) a second forward pulse of a second forward duration and second forward intensity;
4) a second pulse break;
5) a third forward pulse, the third forward pulse having at least substantially the same duration and/or intensity as the first forward pulse, preferably having the same duration and intensity as the first forward pulse;
6) a third pulse break;
7) a first reverse pulse of a first reverse duration and first reverse intensity;
8) a fourth pulse break;
9) a fourth forward pulse, the fourth forward pulse having at least substantially the same duration and/or intensity as the first forward pulse, preferably having the same duration and intensity as the first forward pulse;
10) a fifth pulse break;
11) a fifth forward pulse, the fifth forward pulse having a different forward duration and/or a different forward intensity from at least one of the first forward pulse and the second forward pulse;
12) a sixth pulse break;
13) a sixth forward pulse, the sixth forward pulse having at least substantially the same duration and/or intensity as the first forward pulse, preferably having the same duration and intensity as the first forward pulse; and
14) a seventh pulse break.

In addition, as further explained below, the repeatable pulse plating sequence may also include a longer duration rest period at some point during the repeatable pulse plating sequence.

In one embodiment, the one or more rectifiers are programmable to plate the first side and the second side of the substrate. In one embodiment, the repeatable sequence on a first side of the substrate is the same as the repeatable sequence on the second side of the substrate. In another embodiment, the repeatable sequence on the first side of the substrate is the same as the repeatable sequence on the second side of the substrate, except done in reverse order. In still another embodiment, the repeatable sequence on the second side of the substrate is different from the repeatable sequence on the first side of the board.

The intensity of the second forward pulse and the intensity of the fifth forward pulse may be in the range of 100% to 500% of the intensity of the other forward pulses (i.e., the first, third, fourth, and sixth forward pulses). In one embodiment, the second forward pulse has an intensity that is 100-300% higher than the intensity of the first forward pulse and the fifth forward pulse has an intensity that is 100% to 300% higher than the intensity of the first forward pulse. In another preferred embodiment, the intensity of the second forward pulse is higher than the intensity of the fifth forward pulse. Other configurations of forward pulses including sequences with forward pulses of different intensities and different durations can also be used.

Each of the forward pulse periods may have a duration of about 10 to about 500 ms, more preferably about 80 to about 150 ms, more preferably about 100 to about 130 ms.

In addition, the duration of the reverse pulse period is preferably within the range of about 40 to about 450 ms, more preferably about 50 to about 150 ms, more preferably about 100 to about 130 ms, most preferably within the range of about 110 to about 120 ms.

The duration of the pulse break between the one or more forward pulses and the one or more reverse pulses is within the range of 1 to 50 ms, more preferably in the range of 10 to 20 ms.

In addition, in one embodiment, a longer duration rest period is also included in the pulse sequence, which longer duration rest period on a first side of the substrate is selected to coincide with a forward pulse having a higher intensity than the intensity of the first forward pulse on the second side. The longer duration rest period and the forward pulse having the higher intensity may preferably be of at least substantially the same duration. In one embodiment the longer duration rest period is preferably within the range of about 50 to about 400 ms, more preferably about 60 to about 150 ms, more preferably about 80 to about 130 ms, most preferably within the range of about 110 to about 120 ms.

In one embodiment, one or more of the pulse breaks on the first side and the second side of the substrate are synchronous with each other, meaning that the pulse breaks on the first side of the substrate and the second side of the substrate line up with each other, even if the pulse sequence on the first side of the substrate is different from the pulse sequence on the second side of the substrate.

In one embodiment, one or more of the forward pulses of the first forward duration and first forward intensities are synchronous with each other, meaning that one or more forward pulses having the same duration and intensity as first forward pulse on the first side of the substrate and the second side of the substrate line up with each other, even if the pulse sequence on the first side of the substrate is different from the pulse sequence on the second side of the substrate.

In one embodiment, the set of pulse plating periods on the second side of the substrate is aligned so that a forward pulse having a second forward duration and second forward intensity or a forward pulse having a different forward duration and/or a different forward intensity from at least one of the first forward pulse or the second forward pulse on a first side of the substrate is aligned with a longer duration rest period on the second side of the substrate and/or a forward pulse having a second forward duration and second forward intensity or a forward pulse having a different forward duration and/or a different forward intensity from at least one of the first forward pulse or the second forward pulse on a first side of the substrate is aligned with a reverse pulse on the second side of the substrate.

In one embodiment, the set of pulse plating periods on the second side of the substrate is aligned so that a forward pulse having a second forward duration and second forward intensity is aligned with a longer duration rest period on the second side of the substrate and a forward pulse having a different forward duration and/or a different forward intensity from at least one of the first forward pulse or the second forward pulse on a first side of the substrate is aligned with a reverse pulse on the second side of the substrate.

In still another embodiment of the invention, a portion of the waveform in the repeatable sequence is repeated. For example, after a first forward pulse of first forward intensity and first forward duration followed by a pulse break on the first and second sides of the substrate, the waveform may include a sequence of forward pulses of the first forward intensity and second forward duration alternated with reverse pulses of a reverse intensity and reverse duration, wherein the reverse duration is at least substantially the same as the second forward duration on a first side of the electronic substrate and pulses of the first forward intensity and second forward duration on a second side of the electronic substrate coinciding with the sequence of forward and reverse pulses on the first side of the substrate. This sequence may be followed by one or more additional pulses of the first forward intensity and first forward duration followed by the sequence of pulses applied to the opposite side of electronic substrate. This may in turn be followed by a pulse break and another forward pulse of the first forward intensity and first forward duration.

The inventors of the present invention have also found that while the bridging performance is exemplary using the complex pulse plating waveform sequence described herein, the filling performance can be problematic under certain conditions. In particular, without wishing to be bound by theory, the inventors of the present invention believe that consumption of oxygen in the system over time can affect the fill performance. However, while the addition of oxygen to the system to replace oxygen consumed in the system has been suggested, this option is not practical because bubbles generated by the addition of oxygen can be incorporated into the deposit, which is undesirable. Therefore, it would be desirable to provide a process that can isolate oxygen depletion in the system.

The inventors had previously developed a single-step, single solution plating chemistry, as described, for example in U.S. Pat. Pub. No. 2021/0130970. While this single step, single solution chemistry provides an exemplary result under certain conditions and provides an efficient process, other plating conditions and/or plating chemistries can also be used with the complex pulse plating waveform sequence described herein to produce a good result.

In one embodiment, the inventors of the present invention have found that a good result can be obtained by using one electrolyte that is not shared between the process. That is, the same electrolyte is used in isolated tanks for bridging and filling.

In another embodiment, the inventors of the present invention have found that two dissimilar electrolytes can be used, wherein the first electrolyte is used for bridging and the second electrolyte is used for filling. In this embodiment, the two electrolytes may each contain a source of copper, acid and chloride ions, which source of copper, acid and chloride ions may be the same or different and in which the concentrations of each may be the same or different. In addition, the organic additives may also be used at different concentrations and/or in different combinations between the two electrolytes.

FIG. 1 depicts one example of the steps of a through-hole plating process for copper.

As set forth in FIG. 1, through-holes are drilled or otherwise formed in the circuit board. A primary metallization step such as electroless copper or direct metallization is performed after drilling to render the laminate surface within the through-hole and/or blind micro-via conductive. Optionally, the primary metallization layer may be flash plated with a thin layer of copper to increase conductivity and increase robustness. Next, pulse plating is initiated to accelerate filling of the middle of the through-holes while minimizing the amount of surface copper plating. Next, as pulse plating is completed, the center of the through-hole closes, and the waveform is thereafter transitioned to DC current in the same acid copper plating solution or a different acid copper plating solution to plate the through-hole until it is completely metallized.

The process described herein can be used for metallizing a substrate having a thickness of between 0.005 and about 3 mm, more preferably between about 0.01 and about 1.0 mm, most preferably between about 0.05 to about 0.5 mm. Through-hole diameters generally range from about 0.005 and about 1 mm, preferably about 0.01 to about 0.8 mm, most preferably about 0.075 to about 0.25 mm. Thus, the process described herein is suitable for metallizing through-holes having an aspect ratio of between about 0.5:1 and about 6:1, more preferably between about 0.5:1 and about 4:1, most preferably between about 0.5:1 and about 3:1.

The electrolytic plating of through-holes described herein combines pulse plating and direct current plating in a prescribed manner to achieve complete filling of the through-holes.

Table 2 depicts the process parameters for direct current and pulse plating current.

TABLE 2

Process Parameters for Direct Current and Pulse Plating

| Type of current | Parameter | Ranges |
|---|---|---|
| Direct Current | Forward current | 0.5 to 7.0 ASD |
| Pulse Plating | Forward current | 0.5 to 9.0 ASD |
| | Single or multi-step | 50% to 300% forward current |
| | Reverse current | Up to 4× forward current density |
| | Frequency | 0.025 to 10.0 Hz |
| | Forward pulse period | 10-500 ms |
| | Reverse pulse period | 40-450 ms |
| | Total dead time | Up to 160 milliseconds |

Table 3 describes an example of the steps in the process, including current density and cycle times. It is noted that Step 1 is an optional step in the process and the process can be performed with only Steps 2 and 3. In another embodiment, Step 2A is included as an optional step to be performed between Steps 2 and 3 as further explained below.

TABLE 3

Steps in plating process

| Step Number | Current Mode | Current Density (ASD) | Cycle time (min) |
| --- | --- | --- | --- |
| 1 | Direct Current | 2.5 | 1-10 |
| 2 | Pulse Current | 1.5-3.5 (base) | 5-180 |
| 2A | Synchronous Pulse Current | 1.5-3.5 (base) | 30-80 |
| 3 | Direct Current | 0.5-3.5 | 5-180 |

By means of the one or more rectifiers the two sides of a printed circuit board can be individually metallized. Furthermore, the one or more rectifiers can be separately programmed with a first repeatable sequence for metallizing a first side of the substrate and a second repeatable sequence for metallizing a second side of the substrate by means of one or more microcontrollers to input the repeatable sequences for the first side and the second side of the substrate.

In still another embodiment, the repeatable sequence may comprise a plurality of two or more or even three or more repeatable sequences arranged in a repeating series. In one embodiment, each repeatable sequence in the plating cycle has the same frequency period, which may be within a range of about 0.5 to about 5 second, more preferably about 1 second, and most preferably exactly one second while the duration of the forward pulse, reverse pulse(s) and rest periods within the sequence(s) may be varied. In another embodiment, the repeatable sequences in the plating cycle may or may not have the same frequency period and the frequency period may be varied in a random or set pattern.

In another embodiment, the durations of the forward pulses, reverse pulse(s), and rest periods are varied as the plating cycle proceeds. In addition, the amplitude and/or peak current densities of the forward pulses, reverse pulse(s), and rest periods can be varied as the plating cycle proceeds.

It is further contemplated that these changes in the repeatable sequence comprising the set of pulse plating periods may be made independently on the first and second sides of the substrate. That is, if undesirable plating properties are observed (i.e., bridging is not at the center of the through-hole, voids are observed, etc.), the pulse plating sequences may be modified to correct the deficiencies and the corrections may be made on the first side of the substrate and/or the second side of the substrates and the modifications may be the same or different on opposite sides of the substrate to achieve a desired result.

That is, depending on factors such as thickness of the substrate, diameter of the through-holes, hole pitch, number and density of the through-holes, it may be desirable to start the plating cycle at a higher or lower current density and as the plating cycle proceeds, sequentially reduce or increase the current density to achieve more efficient through-hole plating or to use a higher or lower current density.

Figure 2:
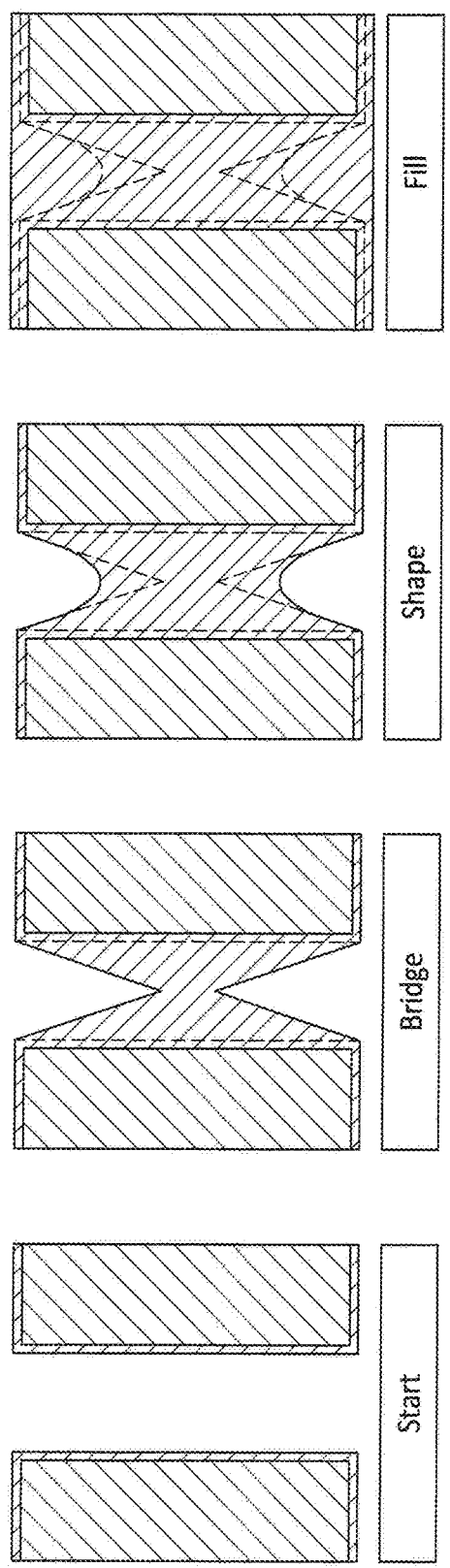
FIG. 2 depicts the steps of through-hole plating of copper in accordance with one aspect of the present invention in which an optional shaping step is included.

In still another embodiment, a first pulse plating cycle is performed as outlined above, which pulse plating cycle may be an asynchronous pulse reverse plating cycle in which the repeatable sequence on the first side of the substrate is the same as the repeatable sequence on the second side of the substrate, except in reverse order. Thereafter a second pulse plating cycle may be performed to shape the copper bridge formed in the first plating cycle as illustrated in FIG. 2. This second pulse plating cycle may be a regular pulse plating cycle with synchronous waveforms on the first and second side of the substrate.

If this second pulse plating cycle is used, the regular pulse plating cycle uses a forward/reverse current ratio of 1:1 to 1:4, more preferably about 1:1 to 1:2. The forward plating pulse is in a range of 10-150 ms and the reverse plating pulse is in the range of about 0.5 to about 10 ms. Plating is performed for about 20 minutes to about 3 hours, more preferably about 30 minutes to about 90 minutes, more preferably about 30 to 45 minutes to shape the copper bridge. This pulse plating cycle can be used, for example, when plating through-holes having a small diameter (which, for example, may be 0.2 mm or less) where there is a tendency to form V-shaped blind vias. In this instance, the bridging creates a V-shape that is very deep, which is difficult to plate using direct plating without any dimples or voids as illustrated in FIG. 2.

Thus, the second pulse plating cycle is used to shape the bridge from the deep-V shape to a U shape. The transition from the first pulse plating cycle utilizing an asynchronous waveform to the second plating cycle utilizing a synchronous waveform helps to shape the copper bridge to allow for more uniform plating of the through-holes without any dimples or voids.

In still another embodiment, the pulse reverse plating cycle is interrupted with a short DC plating step between the two pulse reverse plating cycles which has been found to reduce cavity formation in thicker panels. For example, a first pulse reverse plating cycle may be instituted to begin creation of a copper bridge in the through-holes for a first period of time, which first period of time may be in a range of about 10 to about 100 minutes, more preferably within a range of about 20 to about 60 minutes, more preferably within a range of about 25 to about 45 minutes. Then, a DC plating step may be instituted for a period of about 1 minute to about 30 minutes, more preferably about 5 to about 15 minutes at a current density of about 0.5 to 3.0 ASD, more preferably about 1.0 to about 2.0 ASD. Thereafter a second pulse reverse plating cycle is used to finish creation of the copper bridge in the through-holes for a second period of time, which second period of time may be the same or different from the first period of time. In addition, the current density of the first pulse reverse plating cycle and the second pulse reverse plating cycle may be the same or different.

This step may also be used alone or in combination with the shaping step described above.

Other sequences of pulse reverse plating, DC plating, and/or synchronous pulse plating can also be used depending on factors such as the thickness of the substrate, aspect ratio of the through-holes and density and location of the through-holes on the substrate.

In one embodiment, the process includes a step of monitoring certain parameters of the through-hole filling and modifying the time periods of one or more of the steps in the plating sequence or modifying the amplitude/peak current density if inadequate through-hole plating is observed and/or if the certain parameters are outside of acceptable values.

The peak current density of each of the forward current pulses at the work-piece is preferably adjusted to 15 A/dm$^2$ at most. Particularly preferable is a peak current density of each of the forward current pulses at the workpiece of about 5 A/dm².

The peak current density of the at least one reverse current pulse at the work piece will preferably be adjusted to a value of no more than 60 A/dm². Particularly preferred is a peak current density of the at least one reverse current pulse at the workpiece of about 20 A/dm².

In the further progress of the metallization process at least one parameter of the pulse reverse current can be varied, wherein this parameter is chosen from a group comprising the ratio of the duration of the forward current pulse to the duration of the reverse current pulse and the ratio of the peak current density of the forward current pulse to the peak current density of the reverse current pulse. It has been proven to be particularly advantageous to increase the ratio of the peak current density of the forward current pulse to the peak current density of the reverse current pulse when metallizing the workpiece and/or to decrease the ratio of the duration of the forward current pulse to the duration of the reverse current pulse as further explained above.

As described herein, the aqueous acidic copper electrolyte can be used in conventional vertical or horizontal plating equipment. The plating system can be designed as a vertical hoist, VCP, or horizontal system with inert anodes. In a preferred embodiment, the system is a vertical system with inert anodes.

Examples of suitable anode materials include iridium oxide coating on titanium mesh or mixed metal oxide coated anodes. Other suitable anode materials would also be known to those skilled in the art. The anode is also optionally, but preferably, shielded to optimize macrodistribution.

In one embodiment, the anode material is iridium oxide/tantalum oxide coated titanium. One suitable anode is available from De Nora S.p.A under the tradename De Nora DT. Other suitable anode materials would be known to those skilled in the art and are also usable.

The substrate or at least a portion of its surface may be contacted with the aqueous acid coper plating solution by various methods, including spraying, wiping, dipping, immersing, or by other suitable means.

The process described herein also preferably includes cleaning, etching, reducing, rinsing and/or drying steps as is generally known in the art.

The acid copper electrolyte described herein is equipped with a solution manifold system comprising an array of nozzles for providing direct solution impingement against the panel. Nozzles on either side of the panel are directly aligned with each other and, with the pumps, are capable of solution flows of 0 to 5.0 L/min/nozzle.

Plating can be done in panel, pattern, or button plating mode as is generally known to those skilled in the art.

After plating, the panels can be used as is or the panels can be run through typical processes such as planarization or copper reduction or further layers can be built up where additional blind micro-vias may be stacked on the copper filled through-holes.

Figure 3:
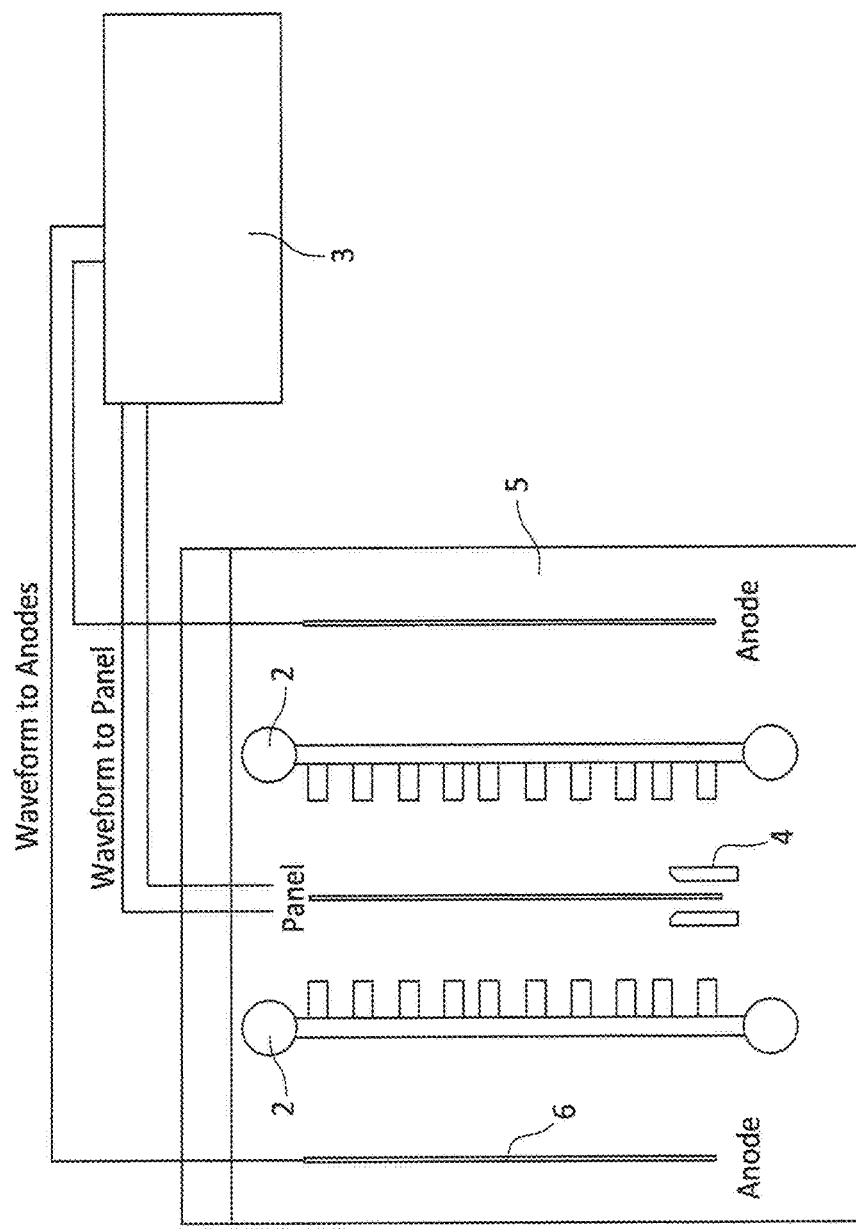
FIG. 3 depicts an apparatus in one embodiment of the present invention.

In one embodiment, and as shown in FIG. 3, the apparatus includes:
A) a plating tank 5 in which the acid copper electrolyte is maintained;
B) a solution delivery system (not shown) comprising a dual box manifold or a vertical pipe manifold;
C) an array of eductor nozzles 2 or cone nozzles arranged to simultaneously impinge both sides of a circuit board immersed in the plating tank 5;
D) a plating rack 4 for securing the PCBs (i.e., panels); and
E) an electroplating power supply rectifier 3 or plurality of rectifiers, each capable of direct current and pulse reverse plating connected to suitable control means, which may include one or more microcontrollers.

In one embodiment, the apparatus may comprise standard vertical hoist or automatic plating equipment. In another embodiment, the apparatus may comprise horizontal plating equipment. However, vertical plating equipment is preferred.

The plating tank 5 preferably comprises a temperature controller to regulate heating and cooling, which is connected to a heating and cooling system that is capable of maintaining the acid copper electrolyte at the desirable bath temperature+/−1.5° C. In a preferred embodiment, the electrolyte is maintained at a temperature of between about 10 and about 50° C., more preferably about 15 to about 45° C., more preferably between about 20 and about 30° C., most preferably at a temperature of between about 22 and about 25° C.

The acid copper electrolyte is optionally, but preferably, agitated. In one embodiment, a clean air agitation sparge dual pipe may be aligned underneath the cathode. Agitation may also be accomplished by mechanical movement of the bath such as by shaking, stirring, or continuous pumping of the electrolyte solution, or by ultrasonic treatment, elevated temperature, or gas feeds, such as purging with air or an inert gas (i.e., argon or nitrogen). Other means of agitation would also be known to those skilled in the art.

The anode to cathode ratio is preferably targeted at greater than 1:0.75, and may be up to 1:2, preferably about 1:1. What is important is to have enough surface area to even the current distribution across the entire PCB.

The plating tank 5 is also preferably equipped with an automatic copper oxide replenishment system to maintain the concentration of copper sulfate to within a desired level. In addition, the apparatus also preferably includes a copper oxide mixing tank and a copper oxide feeder for introducing copper oxide into the replenishment system. The plating tank 5 also includes means for replenishing other ingredients of the acid copper electrolyte and for monitoring the concentration of the ingredients.

The electroplating racks 4 may be coated stainless steel or may be partially or non-coated plating racks. Optionally, the electroplating racks 4 may comprise a coated copper core.

The copper electroplating tank 5 is also preferably outfitted with a continuous solution filtration system that is capable of filtering particle of about 1 micron or more and that is designed to handle at least 3 solution turnovers per hour, preferably at least 4 solution turnovers per hour and more preferably at least 5 solution turnovers per hour.

The apparatus also preferably includes a controller capable of managing heating, cooling, and chemical additions with the plating tank.

Finally, it is also highly desirable that the copper electroplating apparatus be outfitted with a ventilation system as would generally be known to those skilled in the art.

The electroplating power supply rectifier 3 is configured to handle both direct current and pulse reverse current. The rectifier 3 may be water or air cooled. The rectifier 3 may comprise a single rectifier or may comprise a first rectifier for a first side of the substrate and a second rectifier for the second side of the substrate, each of which is programmable with a multistep capability.

As discussed above, as the center of the through-hole bridges or closes, the wave form is transitioned to straight DC current in the same or different acid copper electrolyte. The result is a continuous plating of the through-hole until it is completely filled. Thus, the rectifier(s) is/are programmed to transition the pulse reverse waveform used for bridging to direct current and to continue plating until the through-holes are completely filled.

Alternatively, if two different electrolytes or two different tanks with the same electrolyte are used, once the center of the through hole bridges in the first electrolyte, the substrate may be transferred to a second tank where plating is continued until the through-holes are completely filled. In this instance, if desired, different rectifiers may be used for the different steps in the process.

The box manifold/vertical pipes are designed to include the array of eductor nozzles or cone nozzles. Opposing nozzles are designed front to back side. The nozzles are preferably arranged in a staggered pattern and may be arranged about 2 to about 8 cm apart, more preferably about 3 to about 6 cm apart, most preferably about 4 to about 5 cm apart in both horizontal and vertical direction.

The process is further explained by means of the following examples. In each example, a test panel comprising a plurality of through-holes and a thickness of about 0.45 mm was subjected to the steps set forth in the examples:

Examples 1

An acid copper electrolyte was made up according to the following parameters:

| Ingredient | Make Up |
| --- | --- |
| Copper sulfate | 240 g/L |
| Sulfuric acid | 90 g/L |
| Chloride ions | 80 ppm |
| Accelerator | 0.85 mL/L |
| Suppressor | 10 mL/L |
| Secondary suppressor | 2 mL/L |
| Bath Temperature | 23° C. |

The concentration of copper sulfate was maintained with the addition of copper oxide, on either a manual or automatic basis, based on Amp hours of operation and/or with chemical titration analysis.

The concentration of sulfuric acid and chloride ions was replenished based on chemical titration analysis.

Replenishment of the accelerator, suppressor, and secondary suppressor was accomplished with an automatic dosing system, based on Amp hours of operation and/or cyclic voltametric stripping (CVS) analysis.

A flash plating layer was deposited on the test panel by DC plating at a current density of 1.5 ASD for a period of 5 minutes. Thereafter, pulse reverse plating was performed at a current density of 2.4 ASD for a period of 60 minutes to create a copper bridge in the through-holes, followed by DC plating at a current density of 2.2 ASD for a period of 75 minutes until the through-holes were filled in a vertical plating process.

The pulse plating waveform on a first side and a second side of the test panel followed a sequence of:

| | Side A | | | Side B | |
| --- | --- | --- | --- | --- | --- |
| Step | Duration (ms) | Amplitude (%) | Step | Duration (ms) | Amplitude (%) |
| Step 1 | 110 | 110 | Step 1 | 110 | 110 |
| Step 2 | 10 | 0 | Step 2 | 10 | 0 |
| Step 3 | 110 | 260 | Step 3 | 110 | 0 |
| Step 4 | 10 | 0 | Step 4 | 10 | 0 |
| Step 5 | 120 | 110 | Step 5 | 120 | 110 |
| Step 6 | 20 | 0 | Step 6 | 20 | 0 |
| Step 7 | 110 | −330 | Step 7 | 110 | 150 |
| Step 8 | 10 | 0 | Step 8 | 10 | 0 |
| Step 9 | 110 | 110 | Step 9 | 110 | 110 |
| Step 10 | 10 | 0 | Step 10 | 10 | 0 |
| Step 11 | 110 | 150 | Step 11 | 110 | −330 |
| Step 12 | 10 | 0 | Step 12 | 10 | 0 |
| Step 13 | 120 | 110 | Step 13 | 120 | 110 |
| Step 14 | 20 | 0 | Step 14 | 20 | 0 |
| Step 15 | 110 | 0 | Step 15 | 110 | 260 |
| Step 16 | 10 | 0 | Step 16 | 10 | 0 |

An observation of a cross-section of the test panel showed good plating with no dimples.

Example 2

An acid copper electrolyte was made up as in Example 1.

A flash plating layer was deposited on a test panel by DC plating at a current density of 1.5 ASD for a period of 5 minutes. Thereafter, pulse reverse plating was performed at a current density of 2.4 ASD for a period of 60 minutes to create a copper bridge in the through-holes, followed by DC plating at a current density of 2.2 ASD for 75 minutes until the through-holes were filled in a vertical plating process.

The pulse plating waveform on a first side and a second side of the test panel followed a sequence of:

| | Side A | | | Side B | |
| --- | --- | --- | --- | --- | --- |
| Step | Duration (ms) | Amplitude (%) | Step | Duration (ms) | Amplitude (%) |
| Step 1 | 100 | 150 | Step 1 | 100 | 150 |
| Step 2 | 5 | 0 | Step 2 | 5 | 0 |
| Step 3 | 100 | 260 | Step 3 | 100 | 0 |
| Step 4 | 5 | 0 | Step 4 | 5 | 0 |
| Step 5 | 110 | 150 | Step 5 | 110 | 150 |
| Step 6 | 5 | 0 | Step 6 | 5 | 0 |
| Step 7 | 170 | −330 | Step 7 | 170 | 200 |
| Step 8 | 5 | 0 | Step 8 | 5 | 0 |
| Step 9 | 100 | 150 | Step 9 | 100 | 150 |
| Step 10 | 5 | 0 | Step 10 | 5 | 0 |
| Step 11 | 170 | 200 | Step 11 | 170 | −330 |
| Step 12 | 5 | 0 | Step 12 | 5 | 0 |
| Step 13 | 110 | 150 | Step 13 | 110 | 150 |
| Step 14 | 5 | 0 | Step 14 | 5 | 0 |
| Step 15 | 100 | 0 | Step 15 | 100 | 260 |
| Step 16 | 5 | 0 | Step 16 | 5 | 0 |

An observation of a cross-section of the test panel showed good plating with no dimples.

Example 3

An acid copper electrolyte was made up as in Example 1.

A flash plating layer was deposited by DC plating at a current density of 1.5 ASD for a period of 5 minutes. Thereafter, pulse reverse plating was performed at a current density of 2.4 ASD for a period of 45 minutes to create a copper bridge in the through-holes. Thereafter synchronous pulse plating was performed at a current density of 2.2 ASD for a period of 45 minutes to shape the bridge, followed by DC plating at a current density of 2.2 ASD for a period of 75 minutes until the through-holes were filled in a vertical plating process.

The pulse reverse plating waveform on a first side and a second side of the substrate in the bridging step followed a sequence of:

|  | Side A | | | Side B | |
| --- | --- | --- | --- | --- | --- |
| Step | Duration (ms) | Amplitude (%) | Step | Duration (ms) | Amplitude (%) |
| Step 1 | 110 | 110 | Step 1 | 110 | 110 |
| Step 2 | 10 | 0 | Step 2 | 10 | 0 |
| Step 3 | 110 | 260 | Step 3 | 110 | 0 |
| Step 4 | 10 | 0 | Step 4 | 10 | 0 |
| Step 5 | 120 | 110 | Step 5 | 120 | 110 |
| Step 6 | 20 | 0 | Step 6 | 20 | 0 |
| Step 7 | 110 | −330 | Step 7 | 110 | 150 |
| Step 8 | 10 | 0 | Step 8 | 10 | 0 |
| Step 9 | 110 | 110 | Step 9 | 110 | 110 |
| Step 10 | 10 | 0 | Step 10 | 10 | 0 |
| Step 11 | 110 | 150 | Step 11 | 110 | −330 |
| Step 12 | 10 | 0 | Step 12 | 10 | 0 |
| Step 13 | 120 | 110 | Step 13 | 120 | 110 |
| Step 14 | 20 | 0 | Step 14 | 20 | 0 |
| Step 15 | 110 | 0 | Step 15 | 110 | 260 |
| Step 16 | 10 | 0 | Step 16 | 10 | 0 |

The synchronous pulse plating in the shaping step had the following parameters:

| Parameter | Value |
| --- | --- |
| Reverse/Forward Ratio | 2.5:1 |
| Forward Time | 20 ms |
| Reverse Time | 1 ms |
| Forward current density | 2.2 ASD |

An observation of a cross-section of the test panel showed good plating with no dimples when plating high aspect ratio through-holes.

Example 4

An acid copper electrolyte was made up as in Example 1.
A flash plating layer was deposited on the test panel by DC plating at a current density of 1.5 ASD for a period of 5 minutes. Thereafter, pulse reverse plating was performed at a current density of 2.4 ASD for a period of 45 minutes to create a copper bridge in the through-holes. Thereafter synchronous pulse plating was performed at a current density of 2.7 ASD for a period of 45 minutes to share the bridge, followed by DC plating at a current density of 2.2 ASD for a period of 75 minutes until the through-holes were filled in a vertical plating process.

The pulse reverse plating waveform on a first side and a second side of the test panel followed a sequence of,

|  | Side A | | | Side B | |
| --- | --- | --- | --- | --- | --- |
| Step | Duration (ms) | Amplitude (%) | Step | Duration (ms) | Amplitude (%) |
| Step 1 | 100 | 150 | Step 1 | 100 | 150 |
| Step 2 | 5 | 0 | Step 2 | 5 | 0 |
| Step 3 | 100 | 260 | Step 3 | 100 | 0 |
| Step 4 | 5 | 0 | Step 4 | 5 | 0 |
| Step 5 | 110 | 150 | Step 5 | 110 | 150 |
| Step 6 | 5 | 0 | Step 6 | 5 | 0 |
| Step 7 | 170 | −330 | Step 7 | 170 | 200 |
| Step 8 | 5 | 0 | Step 8 | 5 | 0 |
| Step 9 | 100 | 150 | Step 9 | 100 | 150 |
| Step 10 | 5 | 0 | Step 10 | 5 | 0 |
| Step 11 | 170 | 200 | Step 11 | 170 | −330 |
| Step 12 | 5 | 0 | Step 12 | 5 | 0 |
| Step 13 | 110 | 150 | Step 13 | 110 | 150 |
| Step 14 | 5 | 0 | Step 14 | 5 | 0 |
| Step 15 | 100 | 0 | Step 15 | 100 | 260 |
| Step 16 | 5 | 0 | Step 16 | 5 | 0 |

The synchronous pulse plating in the shaping step had the following parameters:

| Parameter | Value |
| --- | --- |
| Reverse/Forward Ratio | 3:1 |
| Forward Time | 100 ms |
| Reverse Time | 5 ms |
| Forward current density | 2.7 ASD |

An observation of a cross-section of the plated test panel showed good plating with no dimples when plating high aspect ratio through-holes.

Example 5

An acid copper electrolyte was made up as in Example 1.
A test panel was subjected to the following plating cycle:
1) A flash plating layer was deposited by DC plating at a current density of 1.5 ASD for a period of 5 minutes.
2) A first pulse reverse plating was performed at a current density of 2.4 ASD for a period of 30 minutes to begin creating a copper bridge in the through-holes.
3) A short (i.e., 5 minutes) DC plating step was performed at a current density of 1.0 ASD to reduce cavity formation in the through-holes.
4) A second pulse reverse plating was performed at a current density of 1.4 ASD for a period of 45 minutes to finish creating the copper bridge in the through-hole.
5) A synchronous pulse plating was performed at a current density of 2.0 ASD for a period of 5 minutes to shape the bridge.
6) DC plating was performed at a current density of 1.2 ASD for a period of 30 minutes followed by DC plating at a current density of 2.0 ASD for a period of 45 minutes to fill the through-holes in a vertical plating process.

The pulse reverse plating waveform on a first side and a second side of the test panel for both the first and the second pulse reverse plating steps followed a sequence of:

|  | Side A | | | Side B | |
| --- | --- | --- | --- | --- | --- |
| Step | Duration (ms) | Amplitude (%) | Step | Duration (ms) | Amplitude (%) |
| Step 1 | 110 | 110 | Step 1 | 110 | 110 |
| Step 2 | 10 | 0 | Step 2 | 10 | 0 |
| Step 3 | 110 | 260 | Step 3 | 110 | 0 |

-continued

| | Side A | | | Side B | |
|---|---|---|---|---|---|
| Step | Duration (ms) | Amplitude (%) | Step | Duration (ms) | Amplitude (%) |
| Step 4 | 10 | 0 | Step 4 | 10 | 0 |
| Step 5 | 120 | 110 | Step 5 | 120 | 110 |
| Step 6 | 20 | 0 | Step 6 | 20 | 0 |
| Step 7 | 110 | −330 | Step 7 | 110 | 150 |
| Step 8 | 10 | 0 | Step 8 | 10 | 0 |
| Step 9 | 110 | 110 | Step 9 | 110 | 110 |
| Step 10 | 10 | 0 | Step 10 | 10 | 0 |
| Step 11 | 110 | 150 | Step 11 | 110 | −330 |
| Step 12 | 10 | 0 | Step 12 | 10 | 0 |
| Step 13 | 120 | 110 | Step 13 | 120 | 110 |
| Step 14 | 20 | 0 | Step 14 | 20 | 0 |
| Step 15 | 110 | 0 | Step 15 | 110 | 260 |
| Step 16 | 10 | 0 | Step 16 | 10 | 0 |

The synchronous pulse plating in the shaping step had the following parameters:

| Parameter | Value |
|---|---|
| Reverse/Forward Ratio | 2.5:1 |
| Forward Time | 20 ms |
| Reverse Time | 1 ms |
| Forward current density | 2 ASD |

In one embodiment and as described below in Examples 6 and 7, the repeatable sequence comprising the set of pulse plating periods comprises one or more forward pulses, one or more reverse pulses and one or more pulse breaks arranged in any order and in which the set of pulse plating periods includes a subset of pulse plating periods within the set of pulse plating periods, which subset of pulse plating periods may be repeated one or more times. The subset of pulse plating periods may comprise a series of one or more forward pulses which may or may not be interspersed with one or more reverse pulses, which forward pulses and reverse pulses have a different duration than the forward pulses and reverse pulses not in the subset of pulse plating periods and wherein the forward pulses and the reverse pulses in the subset have the same or different intensity. In one embodiment, the subset of pulse plating periods applied to a first side of the substrate is different from the subset of pulse plating periods simultaneously being applied to the second side of the substrate. In one embodiment, the set of pulse plating periods that includes the subset of pulse plating periods includes one or more pulse breaks but does not include a longer duration rest period.

Example 6

An acid copper electrolyte was made up as in Example 1.

A flash plating layer was deposited on a test panel by DC plating at a current density of 1.5 ASD for a period of 5 minutes. Thereafter, pulse reverse plating was performed at a current density of 2.4 ASD for a period of 60 minutes to create a copper bridge in the through-holes, followed by DC plating at a current density of 2.2 ASD for 75 minutes until the through-holes were filled in a vertical plating process.

The pulse reverse plating waveform on a first side and a second side of the test panel for the pulse reverse plating steps followed a sequence of:

| | Side A | | | Side B | |
|---|---|---|---|---|---|
| Step | Duration (ms) | Amplitude (%) | Step | Duration (ms) | Amplitude (%) |
| Step 1 | 160 | 100 | Step 1 | 160 | 100 |
| Step 2 | 5 | 0 | Step 2 | 5 | 0 |
| Step 3 | 35 | −300 | Step 3 | 35 | 100 |
| Step 4 | 35 | 100 | Step 4 | 35 | 100 |
| Step 5 | 35 | −300 | Step 5 | 35 | 100 |
| Step 6 | 35 | 100 | Step 6 | 35 | 100 |
| Step 7 | 35 | −300 | Step 7 | 35 | 100 |
| Step 8 | 160 | 100 | Step 8 | 160 | 100 |
| Step 9 | 160 | 100 | Step 9 | 160 | 100 |
| Step 10 | 35 | 100 | Step 10 | 35 | −300 |
| Step 11 | 35 | 100 | Step 11 | 35 | 100 |
| Step 12 | 35 | 100 | Step 12 | 35 | −300 |
| Step 13 | 35 | 100 | Step 13 | 35 | 100 |
| Step 14 | 35 | 100 | Step 14 | 35 | −300 |
| Step 15 | 5 | 0 | Step 15 | 5 | 0 |
| Step 16 | 160 | 100 | Step 16 | 160 | 100 |

As seen in Example 6, the subset of pulse plating periods includes a first subset of pulse plating periods applied to a first side of the substrate that includes forward pulses interspersed with reverse pulses and the subset of pulse plating periods at least substantially simultaneously being applied to the second side of the substrate that includes forward pulses and a second subset of pulse plating periods in which the subsets of pulse plating periods simultaneously applied to the first side of the substrate and the second side of the substrate are switched.

Example 7

An acid copper electrolyte was made up as in Example 1.

A flash plating layer was deposited on a test panel by DC plating at a current density of 1.5 ASD for a period of 5 minutes. Thereafter, pulse reverse plating was performed at a current density of 2.4 ASD for a period of 60 minutes to create a copper bridge in the through-holes, followed by DC plating at a current density of 2.2 ASD for 75 minutes until the through-holes were filled in a vertical plating process.

The pulse reverse plating waveform on a first side and a second side of the test panel for the pulse reverse plating steps followed a sequence of:

| | Side A | | | Side B | |
|---|---|---|---|---|---|
| Step | Duration (ms) | Amplitude (%) | Step | Duration (ms) | Amplitude (%) |
| Step 1 | 100 | 100 | Step 1 | 100 | 100 |
| Step 2 | 15 | 0 | Step 2 | 15 | 0 |
| Step 3 | 100 | 100 | Step 3 | 100 | 100 |
| Step 4 | 4 | 100 | Step 4 | 4 | 100 |
| Step 5 | 11 | −300 | Step 5 | 11 | 100 |
| Step 6 | 100 | 100 | Step 6 | 100 | 100 |
| Step 7 | 10 | 0 | Step 7 | 10 | 0 |
| Step 8 | 10 | 0 | Step 8 | 10 | 0 |
| Step 9 | 100 | 100 | Step 9 | 100 | 100 |
| Step 10 | 11 | 100 | Step 10 | 11 | −300 |
| Step 11 | 4 | 100 | Step 11 | 4 | 100 |
| Step 12 | 100 | 100 | Step 12 | 100 | 100 |
| Step 13 | 15 | 0 | Step 13 | 15 | 0 |
| Step 14 | 100 | 100 | Step 14 | 100 | 100 |

Steps 4 and 5 and corresponding steps 10 and 11 were repeated 10 times. However, it is noted that the duration and intensity of the pulse periods of steps 4 and 5 (and 10 and 11) may be varied so that the number of repeats may be changed. That is, while the steps were repeated 10 time, the number of repeats may be at least 4 or at least 6 or at least 8 or at least 10 or at least 12 or the number of steps required to achieve the desired result.

As seen in Example 7, the subset of pulse plating periods includes a first subset of pulse plating periods applied to a first side of the substrate that includes forward pulses interspersed with reverse pulses and the subset of pulse plating periods at least substantially simultaneously being applied to the second side of the substrate that includes forward pulses and a second subset of pulse plating periods in which the subsets of pulse plating periods simultaneously applied to the first side of the substrate and the second side of the substrate are switched.

Thus, it can be seen that the complex waveforms described herein allow for the metallization of through-holes and/or blind micro-vias that do not exhibit any defects, such as unacceptable voids, cavities, or excessive dimples.

What is claimed is:

1. A method of plating a metal on an electronic substrate, wherein the electronic substrate comprises one or more features, wherein the one or more features comprise one or more through-holes in the electronic substrate, the method comprising the steps of:
   a) preparing the electronic substrate to receive metal plating thereon;
   b) bringing the electronic substrate and at least one counter electrode into contact with an electroplating solution comprising a source of metal ions of the metal to be plated;
   c) electrically polarizing first and second sides of the electronic substrate to initiate metal plating thereon, wherein the electroplating solution plates the one or more through-holes using a plating cycle until metallization is complete;
   wherein the plating cycle comprising the steps of, in order:
   1) pulse plating for a first time period on a first side and a second side of the electronic substrate to cause metal to preferentially plate in the center of the one or more through-holes, wherein the metal merges together in the center of the one or more through-holes to form two opposing blind vias; and
   2) direct plating for a second time period to fill the two opposing blind vias formed by pulse plating;
   wherein the pulse plating step comprises applying an electrical current to electrodeposit metal from the electroplating solution to the first side and second side of the electronic substrate, wherein the electrical current is applied as a pulse plating cycle comprising a repeatable sequence, wherein the repeatable sequence comprises a set of pulse plating periods, each set of pulse plating periods including, in any order:
   (i) at least a first forward pulse period;
   (ii) at least a first reverse pulse period;
   (iii) at least a second forward pulse period; and
   (iv) at least one rest period,
   wherein pulse breaks are interposed between at least one of the pulse plating periods in the set of pulse plating periods;
   wherein the at least one rest period is longer in duration than each pulse break, wherein the at least one rest period on one side of the electronic substrate coincides with a forward pulse on the opposite side of the electronic substrate,
   wherein the at least one rest period and the forward pulse have at least substantially the same duration.

2. The method according to claim 1, wherein the electroplating solution is an acid copper plating bath comprising a source of copper ions.

3. The method according to claim 1, wherein the same electroplating solution is used for the pulse plating step and the direct plating step.

4. The method according to claim 3, wherein the pulse plating step and the direct plating step are performed in separate tanks.

5. The method according to claim 1, wherein the electroplating solutions used in the pulse plating step and the direct plating step are different from each other.

6. The method according to claim 1, wherein the metallized electroplated metal deposit completely fills the one or more through-holes and deposits a conformal metal deposit on the electronic substrate.

7. The method according to claim 2, wherein the acid copper electroplating bath is maintained at a temperature of between about 15 and about 45° C.

8. The method according to claim 1, further comprising the step of direct current plating using forward current for a time period prior to step 1), wherein direct current plating for the first time period deposits a flash copper layer on the surfaces of the one or more through-holes.

9. The method according to claim 1, wherein the electronic substrate is contacted with the electroplating solution by immersing the electronic substrate in the electroplating solution.

10. The method according to claim 1, wherein the pulse plating cycle comprising the repeatable sequence applied to the first side of the electronic substrate is the same as the pulse plating cycle comprising the repeatable sequence applied to the second side of the electronic substrate.

11. The method according to claim 1, wherein the pulse plating cycle comprising the repeatable sequence applied to the first side of the electronic substrate is different from the pulse plating cycle comprising the repeatable sequence applied to the second side of the electronic substrate.

12. The method according to claim 1, wherein pulse breaks in the first set of pulse plating periods applied to the first side of the electronic substrate are synchronous with the pulse breaks in the second set of pulse plating periods applied to the second side of the electronic substrate.

13. The method according claim 1, wherein one or more forward pulses having the same duration and intensity as first forward pulse on the first side of the electronic substrate and the second side of the electronic substrate line up with each other, even if the set repeatable sequence comprising the set of pulse plating periods applied to the first side of the electronic substrate is different from the repeatable sequence comprising the set of pulse plating periods applied to the second side of the electronic substrate.

14. The method according to claim 1, wherein each repeatable sequence comprising the set of pulse plating periods has a duration of between about 0.5 and about 5 seconds.

15. The method according to claim 14, wherein each repeatable sequence has a duration of 1 second.

16. The method according to claim 1, wherein the repeatable sequence comprises a plurality of two or more repeatable sequences arranged in a repeating series.

17. The method according to claim 1, wherein the duration of each first forward pulse period and second forward pulse period is independently in the range of about 80 to 250 ms, the duration of each reverse pulse period is in the range of about 50 to about 150 ms, and the duration of each pulse break is in the range of about 1 to about 50 ms.

18. The method according to claim 1, wherein pulse breaks are interposed between at least some of the pulse plating periods in the set of pulse plating periods.

19. The method according to claim 18, wherein pulse breaks are interposed between each of the pulse plating periods in the set of pulse plating periods.

20. A method of plating a metal on an electronic substrate, wherein the electronic substrate comprises one or more features, wherein the one or more features comprise one or more through-holes in the electronic substrate, the method comprising the steps of:
  a) preparing the electronic substrate to receive metal plating thereon;
  b) bringing the electronic substrate and at least one counter electrode into contact with an electroplating solution comprising a source of metal ions of the metal to be plated;
  c) electrically polarizing first and second sides of the electronic substrate to initiate metal plating thereon, wherein the electroplating solution plates the one or more through-holes using a plating cycle until metallization is complete;
  wherein the plating cycle comprising the steps of, in order:
    1) pulse plating for a first time period on a first side and a second side of the electronic substrate to cause metal to preferentially plate in the center of the one or more through-holes, wherein the metal merges together in the center of the one or more through-holes to form two opposing blind vias; and
    2) direct plating for a second time period to fill the two opposing blind vias formed by pulse plating;
  wherein the pulse plating step comprises applying an electrical current to electrodeposit metal from the electroplating solution to the first side and second side of the electronic substrate, wherein the electrical current is applied as a pulse plating cycle comprising a repeatable sequence,
  wherein the repeatable sequence comprises a set of pulse plating periods,
  wherein each set of pulse plating periods consists of, in any order:
    a) a first forward pulse of a first forward duration and first forward intensity;
    b) a second forward pulse of a second forward duration and second forward intensity;
    c) a third forward pulse, the third forward pulse having at least substantially the same duration and/or intensity as the first forward pulse;
    d) a first reverse pulse of a first reverse duration and first reverse intensity;
    e) a fourth forward pulse, the fourth forward pulse having at least substantially the same duration and/or intensity as the first forward pulse;
    f) a fifth forward pulse, the fifth forward pulse having a different forward duration and/or a different forward intensity from at least one of the first forward pulse and the second forward pulse; and
    g) a sixth forward pulse, the sixth forward pulse having at least substantially the same duration and/or intensity as the first forward pulse; and
  wherein a pulse break is interposed after one or more of steps a) to g).

21. The method according to claim 20, wherein the pulse plating cycle is an asynchronous plating cycle, wherein the repeatable sequence applied to the first side of the electronic substrate is the same as the repeatable sequence applied to the second side of the electronic substrate, except in reverse order.

22. The method according to claim 21, wherein after the asynchronous plating cycle is performed for a period of time, a second pulse plating cycle with synchronous waveforms on the first side and the second side of the electronic substrate is applied,
  wherein the asynchronous plating cycle preferentially plates the copper in the center of the one or more through-holes such that the copper merges together in the center of the one or more through-holes to form two opposing blind vias and the second pulse plating cycle shapes the thus formed two opposing blind vias to allow for more uniform plating of the one or more through-holes.

23. The method according to claim 22, wherein the second pulse plating cycle uses a reverse/forward ratio of between about 1:1 to 4:1 and wherein the duration of forward pulses is in the range of about 10 to 150 ms and the duration of the reverse pulses is in the range of about 0.5 to 10 ms.

24. The method according to claim 20, wherein the pulse break is interposed after each of steps a) to g).

* * * * *